(12) United States Patent
Fuergut et al.

(10) Patent No.: US 7,528,054 B2
(45) Date of Patent: May 5, 2009

(54) SEMICONDUCTOR COMPONENT WITH A THIN SEMICONDUCTOR CHIP AND A STIFF WIRING SUBSTRATE, AND METHODS FOR PRODUCING AND FURTHER PROCESSING OF THIN SEMICONDUCTOR CHIPS

(75) Inventors: Edward Fuergut, Dasing (DE); Holger Woerner, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 105 days.

(21) Appl. No.: 11/514,315

(22) Filed: Sep. 1, 2006

(65) Prior Publication Data

US 2007/0096305 A1 May 3, 2007

Related U.S. Application Data

(63) Continuation of application No. PCT/DE2005/000308, filed on Feb. 23, 2005.

(30) Foreign Application Priority Data

Mar. 3, 2004 (DE) .................. 10 2004 010 956

(51) Int. Cl.
*H01L 21/30* (2006.01)

(52) U.S. Cl. .................. 438/459; 438/455; 438/458

(58) Field of Classification Search .................. 438/459, 438/455, 458
See application file for complete search history.

(56) References Cited

U.S. PATENT DOCUMENTS

| 5,105,254 | A | * | 4/1992 | Terao .......................... 257/49 |
| 5,476,566 | A | * | 12/1995 | Cavasin ...................... 156/249 |
| 5,525,273 | A | * | 6/1996 | Konuma et al. ............. 264/1.38 |
| 5,851,845 | A | * | 12/1998 | Wood et al. ................... 438/15 |
| 6,261,869 | B1 | | 7/2001 | Radford et al. |
| 6,391,679 | B1 | | 5/2002 | Anker et al. |
| 6,756,288 | B1 | | 6/2004 | Feil et al. |
| 2002/0048906 | A1 | | 4/2002 | Sakai et al. |
| 2002/0149121 | A1 | | 10/2002 | Shikano et al. |
| 2002/0195701 | A1 | | 12/2002 | Bemmerl et al. |
| 2003/0077885 | A1 | | 4/2003 | Aspar et al. |
| 2003/0134490 | A1 | | 7/2003 | Inuzuka |

FOREIGN PATENT DOCUMENTS

| DE | 198 40 421 A1 | 12/1999 |
| DE | 100 32 283 A1 | 1/2002 |
| EP | 0 556 550 A2 | 8/1993 |
| JP | 2003-142505 A | 5/2003 |
| WO | WO 02/19393 A2 | 3/2002 |
| WO | WO 03/083930 A1 | 10/2003 |

OTHER PUBLICATIONS

Quirk, M. and Serda, J.; "Semiconductor Manufacturing Technology"; 2001; Prentice-Hall Inc., p. 183-184.*

* cited by examiner

*Primary Examiner*—W. David Coleman
*Assistant Examiner*—Vicki B Booker
(74) *Attorney, Agent, or Firm*—Edell, Shapiro & Finnan, LLC

(57) ABSTRACT

A semiconductor component includes a thin semiconductor chip and a wiring substrate that carries the semiconductor chip on its upper side and includes external contacts on its underside and/or its edge sides. The semiconductor chip is preferably produced from monocrystalline silicon having a thickness $d \leq 25$ μm.

13 Claims, 3 Drawing Sheets

SEMICONDUCTOR COMPONENT WITH A THIN SEMICONDUCTOR CHIP AND A STIFF WIRING SUBSTRATE, AND METHODS FOR PRODUCING AND FURTHER PROCESSING OF THIN SEMICONDUCTOR CHIPS

CROSS REFERENCE TO RELATED APPLICATIONS

This application is a continuation of International Application No. PCT/DE2005/000308, filed on Feb. 23, 2005, entitled "Semiconductor Component Comprising a Thin Semiconductor Chip and a Stiff Wiring Substrate, and Method for the Production and Further Processing of Thin Semiconductor Chips," which claims priority under 35 U.S.C. §119 to Application No. DE 102004010956.7 filed on Mar. 3, 2004, entitled "Semiconductor Component Comprising a Thin Semiconductor Chip and a Stiff Wiring Substrate, and Method for the Production and Further Processing of Thin Semiconductor Chips," the entire contents of which are hereby incorporated by reference.

FIELD OF THE INVENTION

The invention relates to a semiconductor component including a thin semiconductor chip and a stiff wiring substrate, and to methods for producing and further processing of thin semiconductor chips to form semiconductor components.

BACKGROUND

Thin semiconductor chips are obtained by thinning finished processed semiconductor wafers having standard dimensions, the semiconductor wafers having a thickness D of 300 µm to 1500 µm and a diameter of a few tens of centimeters (cm). The processed semiconductor wafer to be thinned has a passivation layer on its active upper side. The passivation layer has uncovered metallic contact areas which must not be damaged during thinning in a thinning apparatus. The thinner a semiconductor wafer becomes, the more critical becomes further processing of the thinned semiconductor chips of the thinned semiconductor wafer to form a semiconductor component, so that at semiconductor chip thicknesses of 30 µm a critical thickness is reached which cannot be undershot since semiconductor chips of this type are no longer self-supporting and have a critical fracture behavior. At these minimal thicknesses of less than 30 µm, it is not possible either to achieve handling for application onto the wiring substrate or to achieve fitting of flip-chip contacts without considerable losses in terms of the production yield.

There is nevertheless a need to reduce the chip thickness further, especially as thinner semiconductor chip laminae can also improve the electrical performance. Thus, with extremely thin semiconductor chips it is possible to significantly reduce turn-on times and turn-off times of power diodes and power transistors if power modules with semiconductor chips having a thickness of less than 30 µm can be integrated to form power modules. However, the critical fracture behavior of such thin semiconductor chips appears to be an insurmountable obstacle, so that handling of such thin semiconductor chips has not been possible heretofore.

SUMMARY

The present invention provides a semiconductor component comprising a thin semiconductor chip, the semiconductor component including a semiconductor chip with a thickness d<30 µm. Furthermore, the invention provides methods for producing and further processing of such thin semiconductor chips.

In accordance with the present invention, a semiconductor component is provided comprising a thin semiconductor chip and a stiff wiring substrate. The wiring substrate includes the semiconductor chip on its upper side and external contacts on its underside and/or its edge sides. The semiconductor chip comprises a monocrystalline semiconductor material having a thickness d≦100 µm. The semiconductor chip preferably comprises monocrystalline silicon having a thickness d≦25 µm.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
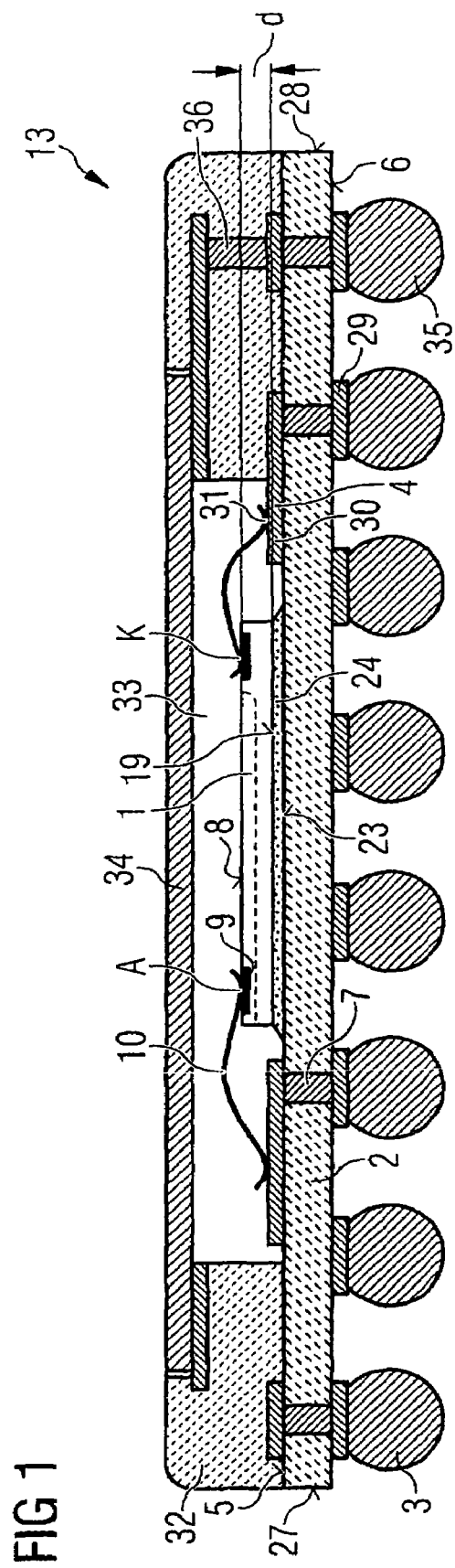
FIG. 1 shows a schematic cross-section through a semiconductor component of one embodiment of the invention.

A semiconductor component is provided which comprises a thin semiconductor chip and a stiff wiring substrate. The wiring substrate includes the semiconductor chin on its upper side and external contacts on its underside and/or its edge sides. The semiconductor chip comprises a monocrystalline semiconductor material having a thickness d≦100 µm. The semiconductor chip preferably comprises monocrystalline silicon having a thickness d≦25 µm.

The semiconductor component of the invention includes a number of advantages including, without limitation, saving space since flat semiconductor components can be realized with such a thin semiconductor chip. When the thinned semiconductor chip is used for a power component, another provided advantage is that turn-on times and turn-off times are shortened, especially as the transit time of the minority charge carriers in the monocrystalline silicon depends on the thickness d of the semiconductor chip. Power semiconductor components of this type have a large-area rear side contact on the rear side of the thin semiconductor chip, and, on the upper side of the semiconductor chip, at least one contact pad if a power diode is involved, and a plurality of contact pads if a power transistor or a thyristor is to be realized with the thin semiconductor chip.

In a preferred embodiment of the invention, the stiff wiring substrate comprises a ceramic material whose coefficient of thermal expansion is adapted or similar to the coefficient of thermal expansion of the semiconductor chip. A ceramic material of this type is associated with the advantage that the thermal stresses between the ceramic material and the thin semiconductor chip under thermal loading are minimized, so that no microcracks occur in the thin semiconductor chip material.

The stiff rewiring substrate can be formed in such a way that it takes up a plurality of thin semiconductor chips required for a power module. In order to wire the semiconductor chips among one another, the wiring substrate is metal-coated and includes metallic wiring structures on its surfaces, that is to say on its upper side and its underside, and is provided with through contacts through the wiring substrate in order to electrically connect the wiring structure on the upper side of the wiring substrate to the wiring structure on the underside of the wiring substrate. The wiring structure on the underside of the wiring substrate may include external contact areas suitable for taking up solder balls as external contacts. The external contacts can be connected to the wiring structure on the upper side of the wiring substrate via the wiring structure on the underside of the wiring substrate and via the through contacts. For taking up the semiconductor chip having a thickness of only a few μm onto the wiring substrate, the wiring structure on the upper side of the wiring substrate includes a chip mounting area, to which the thin semiconductor chip is connected via a soldering layer or via an electrically conductive adhesive layer. The thin semiconductor chip includes, on its active upper side, contact areas which are electrically connected to the rewiring structure on the upper side of the wiring substrate via bonding connections.

In a further embodiment of the invention, the thin semiconductor chip is applied on a chip island of a flat conductor leadframe and the contact areas of the upper side of the thin semiconductor chip are connected to inner flat conductors of the flat conductor leadframe via bonding connections. It is furthermore possible for the thin semiconductor chips to be applied on a wiring substrate made of a plastic as carrier material, the carrier material made of plastic being filled with ceramic particles in order to adapt the coefficient of thermal expansion of the carrier material to the coefficient of thermal expansion of the thin semiconductor chip.

In a further preferred embodiment of the invention, the thin semiconductor chip has a thickness d of $0.5\ \mu m \leqq d \leqq 25\ \mu m$. The lower limit of 0.5 μm results from the limited possibilities of the thinning apparatuses, and also the thinning methods, and the associated manufacturing tolerance limits. A thickness $d \leqq 10\ \mu m$ is preferably sought, in the case of which the advantageous effects of a shortening of the transit time for minority charge carriers through the semiconductor chip are already manifested, thereby enabling steep switch-on and switch-off edges for high current densities of such semiconductor chips. A preferred range for the thickness d of the thin semiconductor chip is $1.2\ \mu m \leqq d \leqq 10\ \mu m$. The manufacturing yield of semiconductor components comprising thin semiconductor chips is greatest in this range, with the result that inexpensive mass production is possible.

A method for the production and further processing of thin semiconductor chips in accordance with the invention includes the following method steps. A monocrystalline semiconductor wafer is provided to be thinned, preferably a silicon wafer, including semiconductor chip positions arranged in rows and columns. The semiconductor chip positions include contact areas that connect the semiconductor chip to corresponding contact pads on a wiring substrate of a semiconductor component. A double sided adhesive film is applied in preparatory fashion onto an upper side of a dimensionally stable self-supporting plate, which is preferably a standard semiconductor wafer and serves as a carrier for the thinning process.

Plates of this type have standardized thickness D which approximately correspond to or are about the same as the thickness of the semiconductor wafer to be thinned and which increase as the diameter of the wafer increases. The double sided adhesive film that is applied onto the plate includes adhesive layers with different properties on its two upper sides. If both adhesive layers comprise a thermoplastic, then the two adhesive layers differ by virtue of the melting point of their thermo plastics. The adhesive layer having the higher melting point is applied onto the standard semiconductor wafer and the adhesive layer having the somewhat lower melting point remains reserved for taking up the semiconductor wafer to be thinned.

In another embodiment of the invention, a thermally sensitive adhesive film is provided with a curable thermosetting plastic on one side and a thermoplastic adhesive on the opposite side. The decomposition temperature of the adhesive layer made of thermosetting plastic is higher than the melting point of the thermoplastic adhesive layer. The plate is connected to the adhesive layer made of thermosetting plastic, while the thermoplastic adhesive layer of the film remains free for taking up the semiconductor wafer to be thinned.

After this preparation of the carrier, the semiconductor wafer to be thinned is applied onto the plate, or onto the thermoplastic adhesive layer of the double sided adhesive film. This gives rise to a sandwich wafer whose upper sides is formed by the rear sides of the semiconductor wafers stacked one above another. The sandwich wafer is mechanically stable and can be introduced into a thinning apparatus for thinning the semiconductor wafer to be thinned. In the thinning apparatus, the original thickness D is reduced to the thickness $d \leqq 25\ \mu m$. After the thinning of the semiconductor wafer to be thinned, the sandwich wafer is then separated into individual sandwich chips along the rows and columns of the thinned semiconductor wafer. The sandwich chips form a self-supporting stack comprising a plate segment of the plate having the standard thickness D, a double sided adhesive film and a thin semiconductor chip, which adheres to the film after thinning and is carried by the plate segment.

This self-supporting sandwich chip is then fixed by the rear side of the thin semiconductor chip onto a chip mounting area of a stiff wiring substrate. A thermosetting plastic adhesive may be used for this purpose, which is cured under thermal action in order to fix the thin semiconductor chip by its rear side on the chip mounting area. The decomposition temperature of the thermosetting plastic adhesive on the chip mounting area is higher than the melting point of the thermoplastic adhesive of the double sided adhesive film. After the curing of the thermosetting plastic adhesive, the thin semiconductor chip is fixedly connected to the wiring substrate in such a way that heating of the fixed sandwich chip has the result that the carrier, or plate segment, together with the double sided adhesive film can be stripped and/ or lifted off from the thin semiconductor chip in the region of the thermoplastic adhesive layer.

This method provides a number of advantages including, without limitation, the following. As a result of the very thin semiconductor chip being carried, the semiconductor chip can be processed further by other conventional methods. The double sided adhesive film may be provided in the form of a thermosensitive adhesive tape and permits virtually force-free demounting of the carrier from the thinned semiconductor chip, it being possible for the carrier to comprise a semiconductor chip material such as a standard semiconductor wafer made of silicon, a metal such as copper or aluminum or a ceramic. Given a suitable machine concept, the demounting of the carrier may be carried out in parallel with a bonding process. As a result, it is advantageously possible for the overall process duration to be kept virtually the same. The carrier plate can be used in conjunction with the thermosensitive adhesive tape in an advantageous manner as early as during the etching back of the semiconductor wafer to be thinned. Consequently, apart from the carrier mounting itself, no additional process steps are required for the production and further processing of thinned semiconductor chips.

An alternative method for the production and further processing of thin semiconductor chips includes the following method steps. First, a monocrystalline semiconductor wafer is provided to be thinned, preferably a silicon wafer, including semiconductor chip positions arranged in rows and columns, the semiconductor chip positions including semiconductor chips for semiconductor components. The semiconductor wafer is subsequently thinned to a predetermined thickness d. A double sided adhesive film is applied in parallel onto an upper side of a plate, which is preferably a standard semiconductor wafer. The thinned semiconductor wafer is then applied by its rear side onto the double sided adhesive film b a thermoplastic adhesive layer with formation of a sandwich wafer.

In this case, the active upper side of the thinned semiconductor wafer forms the upper side of the sandwich wafer. Flip-chip contacts are then applied onto the active upper side of the thinned semiconductor wafer. The sandwich wafer is subsequently separated into individual sandwich chips along the rows and columns of the thinned semiconductor wafer, the sandwich chips forming a self-supporting stack comprising a plate segment having a standard thickness, a double sided adhesive film and a thin semiconductor chip. The sandwich chips with the flip-chip contacts of the thin semiconductor chip are then fixed on a stiff wiring substrate by soldering on the flip-chip contacts. Finally, the sandwich chip is heated and the plate segment with double sided adhesive film is lifted off from the thin semiconductor chip in the region or the thermoplastic adhesive layer.

This method provides a number of advantages including, without limitation, the possibility to realize very thin semiconductor chips with flip-chip contacts and to apply them onto a wiring substrate by their flip-chip contacts without high reject rates occurring in production when populating wiring substrates with the semiconductor chips by soldering on the flip-chip contacts.

A further alternative method for the production and further processing of thin semiconductor chips includes the following method steps. A monocrystalline semiconductor wafer is provided to be thinned, preferably a silicon wafer, including semiconductor chip positions arranged in rows and columns, the semiconductor chip positions including semiconductor chips for semiconductor components. The semiconductor chip is subsequently thinned to a predetermined thickness. A double sided adhesive film is applied in parallel onto an upper side of a dimensionally stable self-supporting plate, which is preferably a standard semiconductor wafer. The thinned semiconductor wafer is then applied by its active upper side onto the double sided adhesive film with a thermoplastic adhesive layer of the film, with formation of a sandwich wafer, the rear sides of the plate and of the semiconductor wafer forming the upper sides of the sandwich wafer.

The sandwich wafer is subsequently separated into individual sandwich chips along the rows and columns of the thinned semiconductor wafer, the sandwich chips forming a self-supporting stack comprising a plate segment having a standard thickness, a double sided adhesive film and a thin semiconductor ship. The sandwich chips are then fixed by the rear side of the thin semiconductor chip onto a chip mounting area of a stiff wiring substrate by an adhesive layer, preferably an adhesive layer made of a thermosetting plastic, and with curing of the adhesive layer. Afterward, the sandwich chips are heated and the plate segment with the double sided adhesive film is lifted off from the thin semiconductor chip in the region of the thermoplastic adhesive layer.

This method provides a number of advantages including, without limitation, that a semiconductor wafer can be thinned in parallel with the preparation of a plate as a carrier of the sandwich wafers to be formed, and production is subsequently carried out with the formation of sandwich chips as a stable self-supporting intermediate product.

In one preferred embodiment, the semiconductor wafer to be thinned includes, in the semiconductor positions, a topmost passivation layer with uncovered contact areas of the active upper side of the semiconductor chips. The adhesive layer made of a thermoplastic then completely covers the passivation layer and the uncovered contact areas during application of the double sided adhesive film. In order to avoid air inclusions and other defects, the adhesive bonding operation is preferably carried in vacuo.

The dimensionally stable self-supporting plate used may preferably be a standard semiconductor wafer made of a monocrystalline silicon wafer having the same external diameter as the semiconductor wafer to be thinned. In addition, the standard semiconductor wafer also has the same outer edge markings in order to ensure correct alignment for later sawing out such a semiconductor chip along the semiconductor chip positions. The double sided adhesive film is preferably applied by an adhesive layer made of a thermosetting plastic onto this upper side of the silicon semiconductor wafer.

This is because the decomposition temperature of thermosetting plastics is significantly higher than the melting point of thermoplastics. The semiconductor wafer to be thinned is then applied by its active upper side and its contact areas to be protected onto the thermoplastic adhesive layer of the film. After this operation, a sandwich semiconductor has been formed which has more than double the thickness of a standard semiconductor wafer and consequently provides planar and stable rear sides for a thinning process.

The thinning process involves carrying out a chemo-mechanical removal by means of a lapping apparatus and subsequently a chemo-mechanical polishing in a polishing apparatus. In this case, the chemical removal is predominant with advancing thinning of the semiconductor wafer. In the thinning process, the wafer to be thinned is thinned to a thickness $d \leq 100$ μm, preferably between $0.5$ μm $\leq d \leq 25$ μm, and more preferably with a thickness range being $1.2$ μm $\leq d \leq 10$ μm.

To summarize, it can be stated that a semiconductor chip to be bonded is initially applied onto a carrier and is also mounted with the carrier. The carrier is connected to the semiconductor chip by a double sided adhesive tape, or a film, at least one side of which has a thermally dissoluble adhesive. After the semiconductor chip has been fixed by adhesive bonding or soldering on a chip mounting area of a wiring substrate, the carrier is removed again by heating. Adhesive residues that remain can be removed from the active upper side of the thinned semiconductor chip, if necessary, in a dissolution and cleaning step.

Exemplary embodiments of the invention are now described with reference to the figures.

FIG. 1 shows a schematic cross-section through a semiconductor component 13 of one embodiment of the invention.

The semiconductor component 13 includes a 10 μm thin semiconductor chip 1 mounted on a wiring substrate 2. The wiring substrate 2 includes a ceramic plate, which imparts stability to the semiconductor component 13 and is adapted to the thin semiconductor chip 1 with respect to its coefficient of thermal expansion. The wiring substrate 2 includes an upper side 5, on which the semiconductor chip 1 is mounted and which includes a wiring structure 4 with metallic interconnects 30 and bonding contact pads 31.

On an underside 6 opposite to the upper side 5, the stiff wiring substrate 2 includes an arrangement of external contact areas 29 which carry external contacts 3 in the form of solder balls. The external contact areas 29 are connected to the wiring structure 4 on the upper side 5 via through contacts 7. Only one semiconductor chip 1 is represented in the cross-section of the semiconductor component 13 shown, the semiconductor chip being connected as a power diode in the semiconductor component 13, the semiconductor component 13 including a power module with a bridge rectifier comprising at least four semiconductor chips of this type.

The advantage of such a thin semiconductor chip 1 of 10 μm for the diodes of the power module resides in the possibility of switching high currents in conjunction with short rising and falling edges. A semiconductor component 13 of this type may include a molding cap or, as shown in FIG. 1, be accommodated in a cavity housing. The cavity housing includes, in addition to the stiff wiring substrate 2, a ceramic frame 32 enclosing a cavity 33 closed off by a metal covering 34 that shields electrical leakage fields. The metal covering 34 may be connected to ground potential via a ground line 36 and an external ground connection 35 for shielding purposes. The remaining external contacts 3 on the underside 6 of the wiring substrate 2 are electrically connected via through contacts 7 to the wiring structure 4 and via the bonding connections 10 to the electrodes A and K on the active upper side 8 of the thin semiconductor chip 1.

The anode electrode A and the cathode electrode K of the thin semiconductor chip 1 connected as a power diode are thus connected via the bonding connections 10 to the wiring structure 4 on the upper side 5 of the wiring substrate 2. The semiconductor chip 1 includes the contact areas 9 on its active upper side 8, the contact areas being protected and maintained during the thinning of the semiconductor chip 1 to the respectively required thickness, preferably d ≦ 10 mm.

The rear side 19 of the thin semiconductor chip 1 is fixed with a thermosetting plastic adhesive 24 on a chip mounting area 23 of the wiring substrate 2. The application of such a thin semiconductor chip 1 onto a wiring substrate 2 constitutes a major challenge for the technology and is explained in more detail in subsequent FIGS. 2 to 7. In FIGS. 2 to 7, components having the same functions as in FIG. 1 are identified by the same reference symbols and are not discussed separately.

As an alternative to the embodiment of the invention that is shown in FIG. 1, where the external contacts 3 are arranged on the underside 6 of the wiring substrate 2, the external contacts 3 may also be arranged on the edge sides 27 and 28 in order to ensure a power supply or signal supply to the semiconductor component 13. Furthermore, instead of the ceramic hollow housing, it is also possible for a molding cap to enclose the thin semiconductor chip 1.

Figure 2:
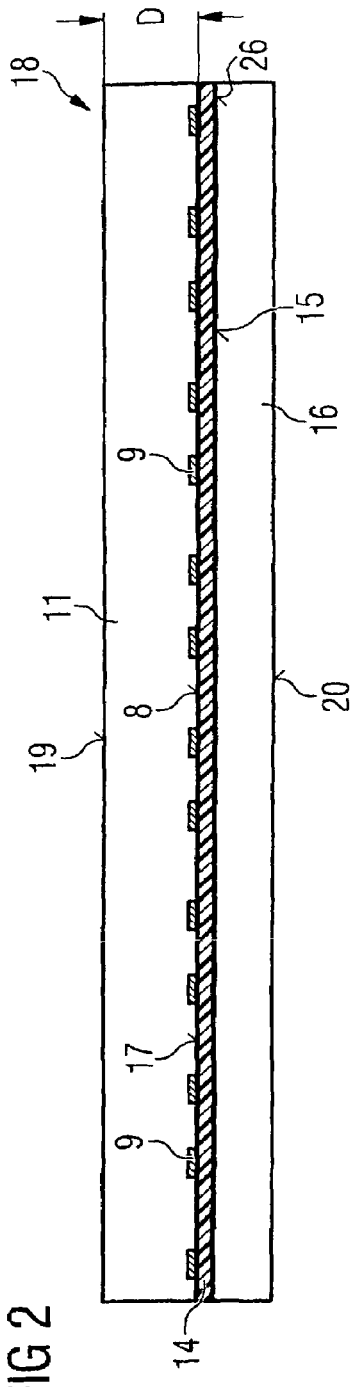
FIG. 2 shows a schematic cross-section through a sandwich wafer prior to thinning of a semiconductor wafer.

FIG. 2 shows a schematic cross-section through a sandwich wafer 18 prior to thinning of a semiconductor wafer 11. Since the aim of this method is not only to produce a thin semiconductor chip but also to handle and protect it for as long as possible in the further processing method with a carrier in the form of a semiconductor chip having a standard thickness D, it is important with the sandwich wafer 18 to provide a double sided adhesive film 14 having adhesive layers 26 and 17 that have a different thermal behavior with respect to each other. Whereas the adhesive layer 26, by which the double sided adhesive film 14 is adhesively bonded onto a mirror-finish-polished upper side 15 of a standard semiconductor wafer 16, comprises a thermosetting plastic in this exemplary embodiment of the method, the adhesive layer 17, on which the semiconductor wafer 11 to be thinned is to be adhesively bonded by its active upper side 8 and the contact areas 9 situated thereon, comprises a thermoplastic.

A thermoplastic adhesive layer 17 of this type has the advantage that it melts when a melting point is reached. Consequently, the parts connected to a thermoplastic adhesive layer 17 can be released from one another again in a manner relatively free of forces. The adhesive layer 26 made of a thermosetting plastic, by contrast, has to be exposed to a decomposition temperature in order to release parts that are connected to one another by a thermosetting plastic. Consequently, the sandwich wafer 18 shown in FIG. 2 forms a self-supporting and dimensionally stable unit which can then be introduced into a thinning apparatus. For this purpose, the rear side 20 of the standard semiconductor wafer 16 is adhesively bonded onto a holder and the rear side 19 of the semiconductor wafer 11 to be thinned is subjected to chemo-mechanical removal.

Figure 3:
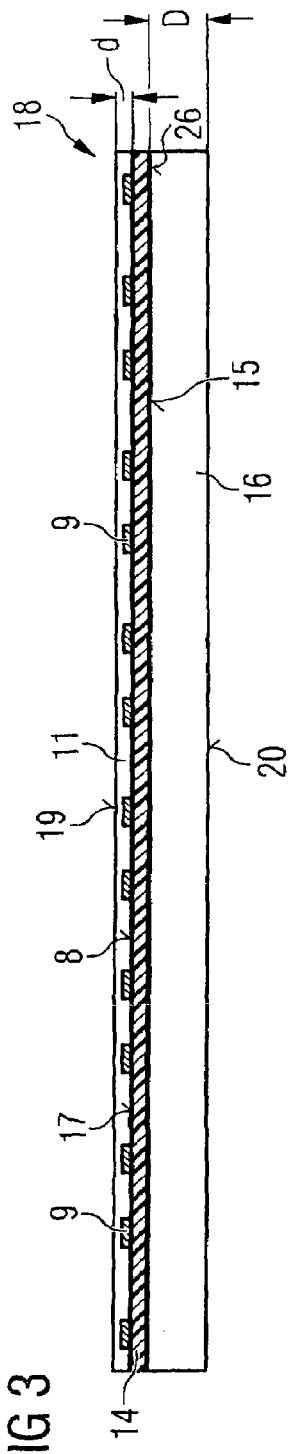
FIG. 3 shows a schematic cross-section through a sandwich wafer with a thinned semiconductor wafer.

FIG. 3 shows a schematic cross-section through a sandwich wafer 18 comprising a thinned semiconductor wafer 11 that emerges from the thinning apparatus. During the thinning operation, the semiconductor wafer 11 that is to be thinned and is shown in FIG. 2 is thinned to a thickness d≦25 μm, and in this exemplary implementation of the invention to a thickness d of 10 μm. The contact areas 9 arranged on the active upper side 8 of the thinned semiconductor wafer 11 remain intact. The rear side 19 of the thinned semiconductor wafer 11 is then adhesively bonded, together with the carrier made of a standard semiconductor wafer 16, onto a sawing table shown in FIG. 4.

Figure 4:
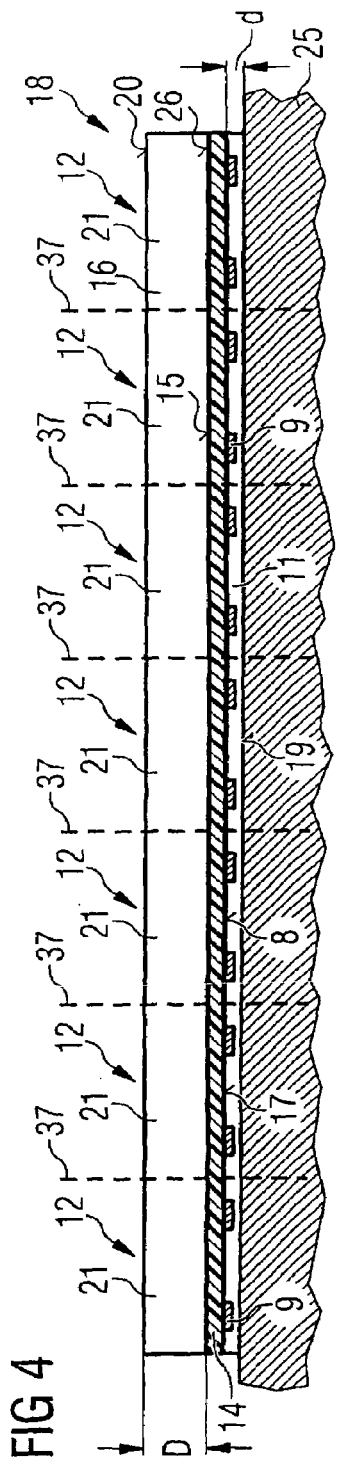
FIG. 4 shows a schematic cross-section through a sandwich wafer on a sawing table before the sandwich wafer is separated into individual sandwich chips.

FIG. 4 shows a schematic cross-section through a sandwich wafer 18 on a sawing table 25 prior to separation into individual sandwich chips 21. The vertical dashed lines 37 shown in FIG. 4 show the sawing tracks along the semiconductor chip positions 12 of the thin semiconductor wafer 11. On the sawing table 25, both semiconductor wafers 11 and 16 of the sandwich wafer 18 can then be jointly separated into individual sandwich chips 21 along the dashed lines 37, thereby giving rise to semiconductor chip stacks which are to be processed further and comprise a semiconductor chip having a standard thickness D and a thin semiconductor chip 1, between which a thermosensitive film is arranged.

Figure 5:
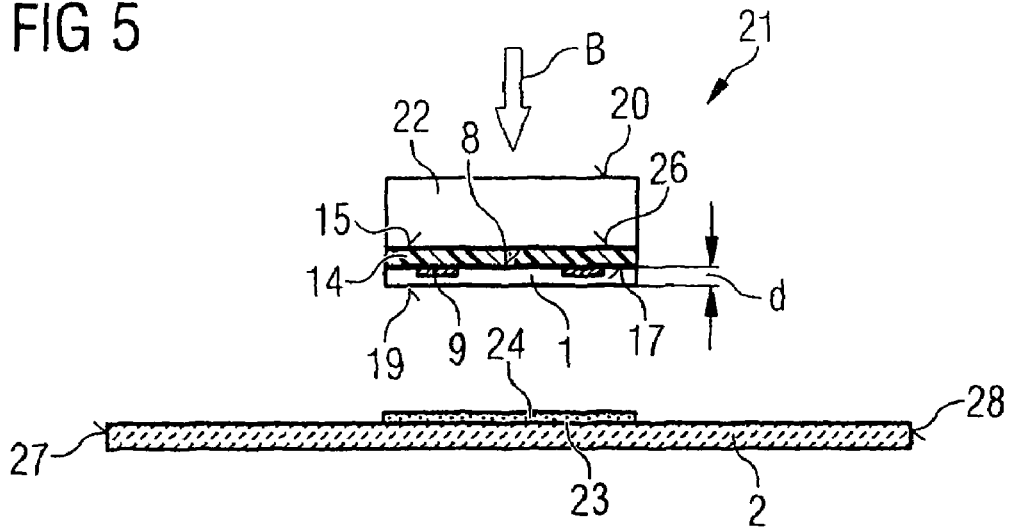
FIG. 5 shows a schematic cross-section through a sandwich chip arranged above a wiring substrate of a semiconductor component.

FIG. 5 shows a schematic cross-section through a sandwich chip 21 arranged above a wiring substrate 2 of a semiconductor component. A sandwich chip 21 of this type is extremely stable and can be processed further using conventional singulation and placement tools. In FIG. 5, the sandwich chip 21 is placed in arrow direction B on a stiff wiring substrate 2 including a chip mounting area 23 that is covered with a thermosetting plastic adhesive 24.

Figure 6:
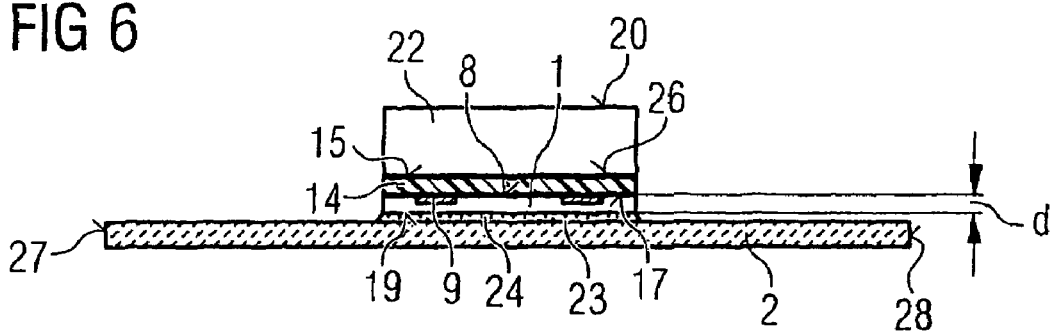
FIG. 6 shows a schematic cross-section through a sandwich chip after the sandwich chip has been placed onto the wiring substrate.

FIG. 6 shows a schematic cross-section through a sandwich chip 21 after the sandwich chip 21 has been placed onto the wiring substrate 2. By heating the construction shown in FIG. 6, the thermosetting plastic 24 on the chip mounting area 23 of the wiring substrate 2 cures, with the result that the thin semiconductor chip 1 is fixed on the wiring substrate 2.

Figure 7:
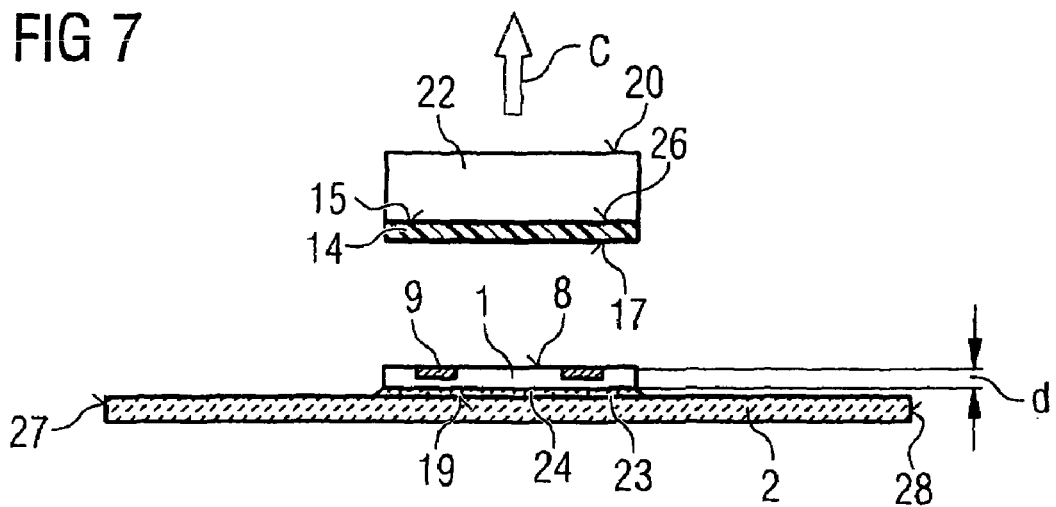
FIG. 7 shows a schematic cross-section through a thin semiconductor chip fixed on the wiring substrate.

FIG. 7 shows a schematic cross-section through a thin semiconductor chip 1 which has been fixed on a wiring substrate 2. Upon melting the thermoplastic adhesive layer 17 of the adhesive film 14, the carrying semiconductor chip 22 with the adhesive film 14 adhered by the adhesive layer 26 is then lifted off in arrow direction C. A wiring structure on the stiff wiring substrate 2 may subsequently be connected to the contact areas 9 of the thin semiconductor chip 1 via bonding connections. Further method steps may then be carried out for packaging the thin semiconductor chip 1 in a housing and for connecting external contacts to the housing in order to complete a semiconductor component or a semiconductor module.

Instead of a thermosetting plastic on the chip mounting area 23, it is also possible to provide a soldering layer which fixes the thin semiconductor chip 1 on the wiring substrate 2. Moreover, instead of the thermosetting plastic adhesive 26 of the film 14, it is possible to provide a thermoplastic adhesive having a higher melting point than the thermoplastic adhesive layer 17 of the double sided adhesive film 14. Due to such temperature differences, the respective further processing step can be supported by way of the temperature.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for producing and further processing of thin semiconductor chips, the method comprising:
   providing a semiconductor wafer including semiconductor chip positions arranged in rows and columns and an active upper side including contact areas associated with the semiconductor chip portions, wherein the semiconductor chip positions include semiconductor chips with semiconductor components;
   thinning the semiconductor wafer to reduce a thickness dimension of the semiconductor wafer to a predetermined thickness d;
   applying a double-sided adhesive film to an upper side of a dimensionally-stable, self-supporting plate;
   applying the plate and a thermoplastic adhesive layer of the double-sided adhesive film onto the active upper side of the semiconductor wafer so as to form a sandwich wafer, wherein a rear side of the plate and a rear side of the semiconductor wafer form opposing sides of the sandwich wafer;
   separating the sandwich wafer into individual sandwich chips along the rows and columns of the thinned semiconductor wafer, wherein each of the sandwich chips includes a self-supporting stack comprising a plate segment having a thickness D, a double-sided adhesive film and a thin semiconductor chip including a rear side that forms part of the rear side of the semiconductor wafer prior to separation of the sandwich wafer into individual sandwich chips;
   fixing a sandwich chip by the rear side of the thin semiconductor chip onto a chip mounting area of a stiff wiring substrate; and
   heating the fixed sandwich chip and lifting off the plate with double-sided adhesive film from the thin semiconductor chip in the region of the thermoplastic adhesive layer.

2. The method of claim 1, wherein the sandwich chip is fixed onto the chip mounting area of the stiff wiring substrate using an adhesive layer that is cured after affixing the sandwich chip to the chip mounting area.

3. The method of claim 1, wherein the sandwich chip is fixed onto the chip mounting area of the stiff wiring substrate with flip-chip contacts that are disposed on the rear side of the thin semiconductor chip, and the flip-chip contacts of the thin semiconductor chip are soldered on the stiff wiring substrate.

4. The method of claim 1, wherein the thinning of the semiconductor wafer to reduce the thickness dimension of the semiconductor wafer to the predetermined thickness d occurs after formation of the sandwich wafer, with the sandwich wafer being introduced into a thinning apparatus.

5. The method of claim 1, wherein the semiconductor wafer includes, in the semiconductor chip positions, a topmost passivation layer with uncovered contact areas of the active upper sides of the semiconductor chips which are completely covered by the adhesive layer during application of the double-sided adhesive film.

6. The method of claim 1, wherein the plate comprises a monocrystalline mirror-finish-polished silicon semiconductor wafer having the same external diameter as the semiconductor wafer.

7. The method of claim 1, wherein the double-sided adhesive film is applied on the upper side of the plate with an adhesive layer made of a thermosetting plastic.

8. The method of claim 1, wherein the double-sided adhesive film is applied to the active upper side of the semiconductor wafer by heating to a melting point of the thermoplastic adhesive layer of the double-sided adhesive film.

9. The method of claim 1, wherein application of the double-sided adhesive film to the active upper side of the semiconductor wafer is carried out in vacuo.

10. The method of claim 1, wherein thinning of the semiconductor wafer is achieved by chemo-mechanical removal of portions of the semiconductor wafer in a lapping apparatus and subsequently polishing the semiconductor wafer in a chemo-mechanical polishing apparatus.

11. The method of claim 1, wherein the thinned wafer has a thickness $d \leq 100\ \mu m$.

12. The method of claim 1, wherein the thinned wafer has a thickness of $0.5\ \mu m \leq d \leq 25\ \mu m$.

13. The method of claim 1, wherein the thinned wafer has a thickness of $1.2\ \mu m \leq d \leq 10\ \mu m$.

* * * * *